United States Patent
Lv

(10) Patent No.: US 10,998,523 B2
(45) Date of Patent: May 4, 2021

(54) ORGANIC LIGHT EMITTING DIODE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Linhong Lv, Hubei (CN)

(73) Assignee: WUHAN CHINA STAR OPTOELECTRONICS SEMICONDUCTOR DISPLAY TECHNOLOGY CO., LTD, Hubei (CN)

(*) Notice: Subject to any disclaimer, the term of this patent is extended or adjusted under 35 U.S.C. 154(b) by 223 days.

(21) Appl. No.: 16/099,435

(22) PCT Filed: Oct. 10, 2018

(86) PCT No.: PCT/CN2018/109672
§ 371 (c)(1),
(2) Date: Nov. 7, 2018

(87) PCT Pub. No.: WO2019/214157
PCT Pub. Date: Nov. 14, 2019

(65) Prior Publication Data
US 2020/0328374 A1    Oct. 15, 2020

(30) Foreign Application Priority Data
May 10, 2018    (CN) .......................... 201810444723.9

(51) Int. Cl.
*H01L 51/52* (2006.01)
*H01L 27/32* (2006.01)

(52) U.S. Cl.
CPC ...... *H01L 51/5253* (2013.01); *H01L 27/3258* (2013.01); *H01L 51/5209* (2013.01); *H01L 51/5225* (2013.01)

(58) Field of Classification Search
CPC ............ H01L 51/5253; H01L 27/3258; H01L 51/5209; H01L 51/5225; H01L 27/32
See application file for complete search history.

(56) References Cited

U.S. PATENT DOCUMENTS

| | | | |
|---|---|---|---|
| 7,508,130 B2 | 3/2009 | Cok | |
| 2007/0114925 A1 | 5/2007 | Cok | |
| 2017/0062757 A1 | 3/2017 | Zhou | |
| 2017/0154935 A1* | 6/2017 | Cai | ...................... H01L 51/5209 |

FOREIGN PATENT DOCUMENTS

CN           105226201 A      1/2016

* cited by examiner

*Primary Examiner* — Anthony Ho
(74) *Attorney, Agent, or Firm* — Soroker Agmon Nordman

(57) ABSTRACT

An organic light emitting diode (OLED) display panel and a display device are provided. The OLED display panel includes a substrate and an organic flat layer, a cathode, and an encapsulation layer stacked on the substrate. The substrate includes a display area and a non-display area. The cathode located on the non-display area includes at least one first via hole, and the encapsulation layer is in contact with the organic flat layer through the at least one first via hole.

16 Claims, 3 Drawing Sheets

ORGANIC LIGHT EMITTING DIODE DISPLAY PANEL AND DISPLAY DEVICE

FIELD OF INVENTION

The present disclosure relates to the field of display technologies, and more particularly to an organic light emitting diode (OLED) display panel and a display device.

BACKGROUND OF INVENTION

Organic light emitting diodes (OLEDs), as a current type of light-emitting device, are now one of many competitive technologies in a new generation of display devices due to wide color gamut, high contrast ratio, energy saving, and foldability. In particular, foldable flexible display technologies of the OLEDs have attracted people's attention and favor.

However, OLED devices are very sensitive to moisture and oxygen, and it is often necessary to package the OLED devices to prevent cathodes from being oxidized. In existing packaging methods, an adhesion between an encapsulation layer and other film layers of the OLED device is not strong, and the encapsulation layer is likely to fall off, thereby causing moisture and oxygen to invade the OLED device, such that a service life of, an OLED display panel is reduced.

SUMMARY OF INVENTION

An object of the present disclosure is to provide an organic light emitting diode (OLED) display panel capable of increasing an adhesion between an encapsulation layer and other film layers of the OLED display panel, reducing a probability of the encapsulation layer falling off, so as to enhance an ability of the OLED display panel to block water oxygen and prolong a service life of the OLED display panel.

To achieve the above object, in a first aspect, an embodiment of the present disclosure provides an organic light emitting diode (OLED) display panel, including:

a substrate including a display area and a non-display area; and an organic flat layer, a cathode, and an encapsulation layer stacked on the substrate;

wherein the cathode located on the non-display area includes at least one first via hole, the encapsulation layer is in contact with the organic flat layer through the at least one first via hole, and the organic flat layer located on the non-display area includes at least one second via hole; and wherein the at least one second via hole is in one-to-one correspondence with the at least one first via hole, and the encapsulation layer is in contact with the organic flat layer through the at least one first via hole and the at least one second via hole, so as to increase a contact area between the organic flat layer and the encapsulation layer.

In an embodiment of the present disclosure, the OLEO display panel further includes an anode, the anode located on the non-display area includes at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer.

In an embodiment of the present disclosure, the at least one first via hole, the at least one second via hole, and the at least one third via hole have a same shape and size.

In an embodiment of the present disclosure, the non-display area includes a signal driving area and a peripheral wiring area, the at least one first via hole includes a first sub via hole and a second sub via hole, the cathode located on the signal driving area includes the at least one first sub via hole, and the cathode located on the peripheral wiring area includes the at least one second sub via hole.

In an embodiment of the present disclosure, the cathode located on the peripheral wiring area includes a first recessed area and a second recessed area, and the first recessed area and the second recessed area are correspondingly disposed on two sides of the at least one second sub via hole.

In an embodiment of the present disclosure, the at least one first sub via hole intersects the at least one second sub via hole.

In an embodiment of the present disclosure, the encapsulation layer includes a first inorganic layer, an organic layer, and a second inorganic layer stacked one on another.

In a second aspect, an embodiment of the present disclosure further provides an organic light emitting diode (OLEO) display panel including:

a substrate including a display area and a non-display area: and an organic flat layer, a cathode, and an encapsulation layer stacked on the substrate;

wherein the cathode located on the non-display area includes at least one first via hole, and the encapsulation layer is in contact with the organic flat layer through the at least one first via hole.

In an embodiment of the present disclosure, the organic flat layer located on the non-display area includes at least one second via hole, the at least one second via hole is in one-to-one correspondence with the at least one first via hole, and the encapsulation layer is in contact with the organic, flat layer through the at least one first via hole and the at least one second via hole, so as to increase a contact area between the organic flat layer and the encapsulation layer.

In an embodiment of the present disclosure, the OLED display panel further includes an anode, the anode located on the non-display area includes at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer.

In an embodiment of the present disclosure, the at least one first via hole, the at least one second via hole, and the at least one third via hole have a same shape and size.

In an embodiment of the present disclosure, the non-display area includes a signal driving area and a peripheral wiring area, the at least one first via hole includes a first sub via hole and a second sub via hole, the cathode located on the signal driving area includes the at least one first sub via hole, and the cathode located on the peripheral wiring area includes the at least one second sub via hole.

In an embodiment of the present disclosure, the cathode located on the peripheral wiring area includes a first recessed area and a second recessed area, and the first recessed area and the second recessed area are correspondingly disposed on two sides of the at least one second sub via hole.

In an embodiment of the present disclosure, the at least one first sub via hole intersects the at least one second sub via hole.

In an embodiment of the present disclosure, the encapsulation layer includes a first inorganic layer, an organic layer, and a second inorganic layer stacked one on another.

In a third aspect, an embodiment of the present disclosure further provides a display device including an organic light emitting diode (OLED) display panel, the OLED display panel including:

a substrate including a display area and a non-display area; and an organic flat layer, a cathode, and an encapsulation layer stacked on the substrate;

wherein the cathode located on the non-display area includes at least one first via hole, and the encapsulation layer is in contact with the organic flat layer through the at least one first via hole.

In an embodiment of the present disclosure, the organic flat layer located on the non-display area includes at least one second via hole, the at least one second via hole is in one-to-one correspondence with the at least one first via hole, and the encapsulation layer is in contact with the organic flat layer through the at least one first via hole and the at least one second via hole, so as to increase a contact area between the organic flat layer and the encapsulation layer.

In an embodiment of the present disclosure, the display device further includes an anode, the anode located on the non-display area includes at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer.

In an embodiment of the present disclosure, the at least one first via hole, the at least one second via hole, and the at least one third via hole have a same shape and size.

In an embodiment of the present disclosure, the encapsulation layer includes a first inorganic layer, an organic layer, and a second inorganic layer stacked one on another.

The embodiments of the present disclosure has beneficial effects that the cathode located on the non-display area includes at least one first via hole, and the encapsulation layer is in contact with the organic flat layer through the at least one first via hole, so as to increase a contact area between the organic flat layer and the encapsulation layer, reduce a probability of the encapsulation layer falling off, enhance an ability of the OLED display panel to block water oxygen, and prolong a service life of the OLEO display panel

DETAILED DESCRIPTION OF PREFERRED EMBODIMENTS

Technical solutions in embodiments of the present disclosure will be dearly and completely described in the following with reference to the accompanying figures. It is understood that the described embodiments are only a part of the embodiments of the present disclosure, and not all of the embodiments. All other embodiments derived by those skilled in the art based on the embodiments of the present disclosure without making any inventive efforts are within the scope of the present disclosure.

Figure 1:
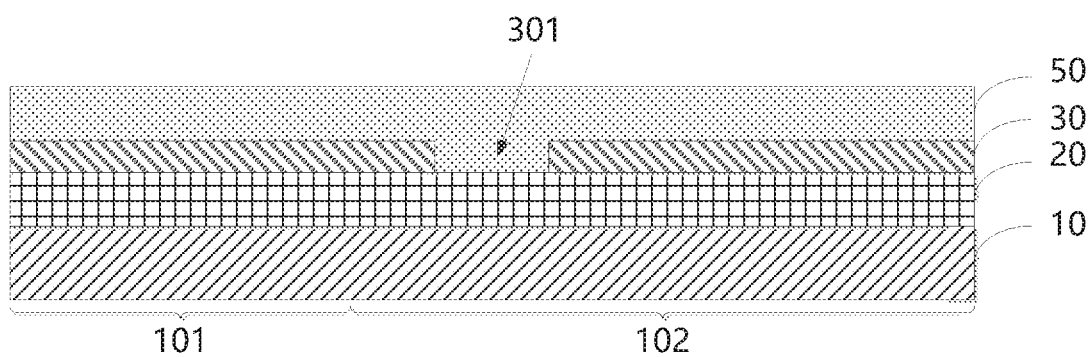
FIG. 1 is a schematic cross-sectional view of an organic light emitting diode (OLED) display panel according to an embodiment of the present disclosure.

Refer to FIG. 1, a schematic cross-sectional view of an organic light emitting diode (OLED) display panel according to an embodiment of the present disclosure is provided.

An embodiment of the present discourse provides an organic light emitting diode (OLED) display panel. The OLED display panel includes a substrate 10 including a display area 101 and a non-display area 102.

In details, the substrate 10 may be an array substrate integrated with a thin film transistor array, and the array substrate 10 may include various circuit structures and/or substrate structures according to actual needs, and the array substrate 10 includes a display area 101 and a non-display area 102.

The OLED display panel includes an organic flat layer 20, a cathode 30, and an encapsulation layer 50 stacked on the substrate. The cathode 30 located on the non-display area 102 includes at least one first via hole 301, the encapsulation layer 50 is in contact with the organic flat layer 20 through the at least one first via hole 301.

In details, the organic flat layer 20, the cathode 30, and the encapsulation layer 50 are stacked on the array substrate 10. A pixel definition layer (not shown in the figures) is further disposed between the organic flat layer 20 and the cathode 30 on the display area 101 of the array substrate 10. The inkjet printing process requires that the pixel definition layer be previously formed on the organic plat layer 20 to define ink droplets and accurately inject the ink droplets into a designated pixel area. A cross-sectional shape of the pixel definition layer is mainly a positive trapezoid, a pixel definition layer is formed on the organic flat layer 20, and an organic light emitting layer (not shown in the figures) is formed in a pixel area defined by the pixel definition layer, preferably material forming the pixel definition layer is a lyophobic material, thereby ensuring that ink droplets do not overflow outside the pixel area when the organic light emitting layer is inkjet printed. In addition, the cathode 30 on the non-display area 102 of the array substrate 10 includes at least one first via hole 301, and in forming the first via hole 301, an encapsulation material is filled to the OLED display panel to form an encapsulation layer 50 on the cathode 30. At this time, the encapsulation layer 50 is in contact with the organic flat layer 20 through the first via hole 301, thereby increasing an adhesion between the encapsulation layer 50 and the organic flat layer 20. It is understood that a shape of the first via hole 301 may be a square or a rectangle, and the specific shape may be determined according to actual conditions.

Figure 2:
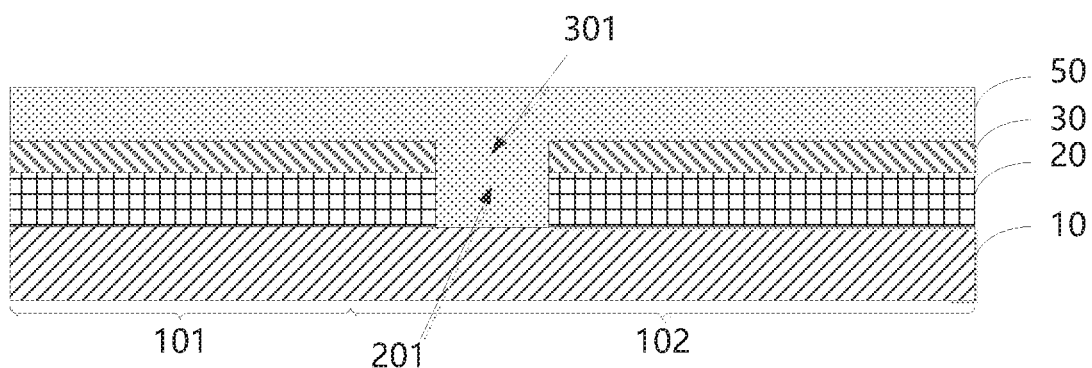
FIG. 2 is a first schematic cross-sectional view of an OLED display panel according to a preferred embodiment of the present disclosure.

In details, refer to FIG. 2, a first schematic cross-sectional view of an OLED display panel according to a preferred embodiment, of the present disclosure is provided.

The organic flat layer located on the non-display area includes at least one second via hole. The at least one second via hole is in one-to-one correspondence with the at least one first via hole, and the encapsulation layer is in contact with the organic flat layer through the at least one first via hole and the at least one second via hole, so as to increase a contact area between the organic flat layer and the encapsulation layer.

Still take the array substrate as an example. The organic flat layer 20 on the non-display area 102 of the array substrate 10 includes at least one second via hole 201. The at least one second via hole 201 is in one-to-one correspondence with the at least one first via hole 301, and the encapsulation layer 50 is in contact with the organic flat layer 20 through the at least one first via hole 301 and the at least one second via hole 201, so as to increase a contact area between the organic flat layer 20 and the encapsulation layer 50. A number of the second via holes 201 may be one or two. Preferably, a number of the first via holes 301 is same as the number of the second via holes 201. It should be noted that by providing the second via hole 201 on the organic flat layer 20, the area of the organic flat layer 20 in contact with the encapsulation layer 50 is increased, thereby improving an adhesion ability of the organic flat layer 20 to a contact surface of the encapsulation layer 50.

The OLED display panel further includes an anode, the anode located on the non-display area includes at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer.

Figure 3:
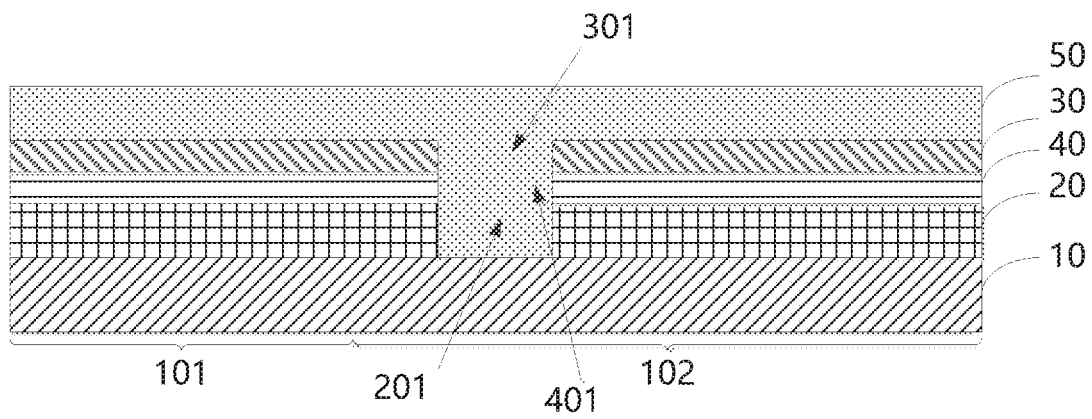
FIG. 3 is a second schematic cross-sectional view of the OLED display panel according to the preferred embodiment of the present disclosure.

Further, refer to FIG. 3, a second schematic cross-sectional view of the OLED display panel according to the preferred embodiment of the present disclosure is provided.

Optionally, the OLED display panel further includes an anode 40. The OLED display panel includes a substrate 10, and the organic flat layer 20, the anode 40, the cathode 30, and the encapsulation layer 50 are stacked on the substrate 10. It should be noted that the anode 40 located on the non-display area 102 of the substrate 10 includes at least one third via hole 401, and the third via hole 401 is in one-to-one correspondence with the first via hole 301 and the second via hole 201. In a specific implementation, the encapsulation layer 50 is in contact with the organic flat layer 20 through the first via hole 301, the second via hole 201, and the third via hole 401. The cathode 30, the organic flat layer 20, and the anode 40 are opened, that is, the first via hole 301, the second via hole 401, and the third via hole 401 are formed, such that the encapsulation layer 50 is in direct contact with the organic flat layer 20, thereby improving the adhesion of the thin film package of the OLED display panel, reducing a probability of the encapsulation layer 50 and the substrate 10 falling off, and improving a package performance of the OLEO display panel.

Preferably, the at least one first via hole 301, the at least one second via hole 201, and the at least one third via hole 401 have a same shape and size.

The non-display area include a signal driving area and a peripheral wiring area, the at least one first via hole includes a first sub via hole and a second sub via hole, the cathode located on the signal driving area includes the at least one first sub via hole, and the cathode located on the peripheral wiring area includes the at least one second sub via hole.

The cathode located on the peripheral wiring area includes a first recessed area and a second recessed area, and the first recessed area and the second recessed area are correspondingly disposed on two sides of the at least one second sub via hole.

Figure 4:
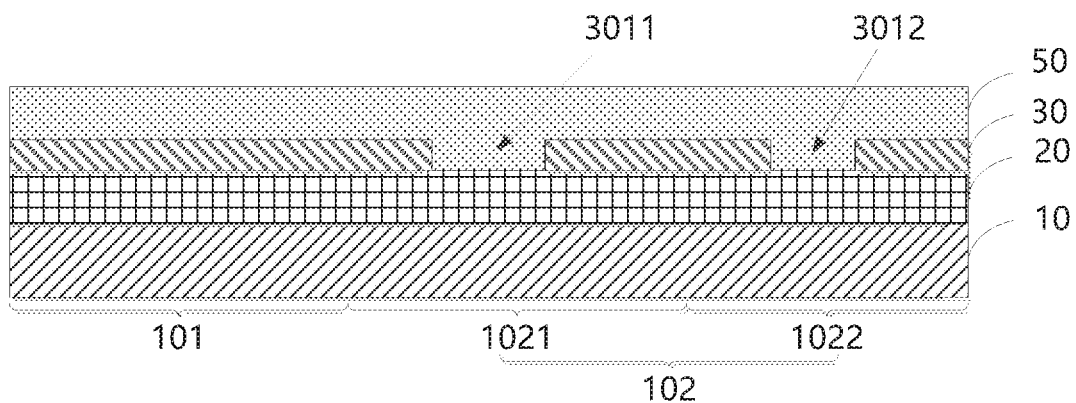
FIG. 4 is a first schematic cross-sectional view of an OLED display panel according to another preferred embodiment of the present disclosure.

Refer to FIG. 4, a schematic cross-sectional view of an OLEO display panel according to another preferred embodiment of the present disclosure is provided.

The non-display area 102 of the array substrate 10 includes a signal driving area 1021 and a peripheral wiring area 1022. The first via hole 301 includes a first sub-via hole 3011 and a second sub-via hole 3012. The cathode on the signal driving area 1021 includes at least one first sub via hole 3011, and the cathode on the peripheral wiring area 1022 includes at least one second sub via hole 3012. For structures of the first sub-via hole 3011 and the second sub-via hole 3012, refer to the previous embodiments, and details are not described herein again.

Figure 5:
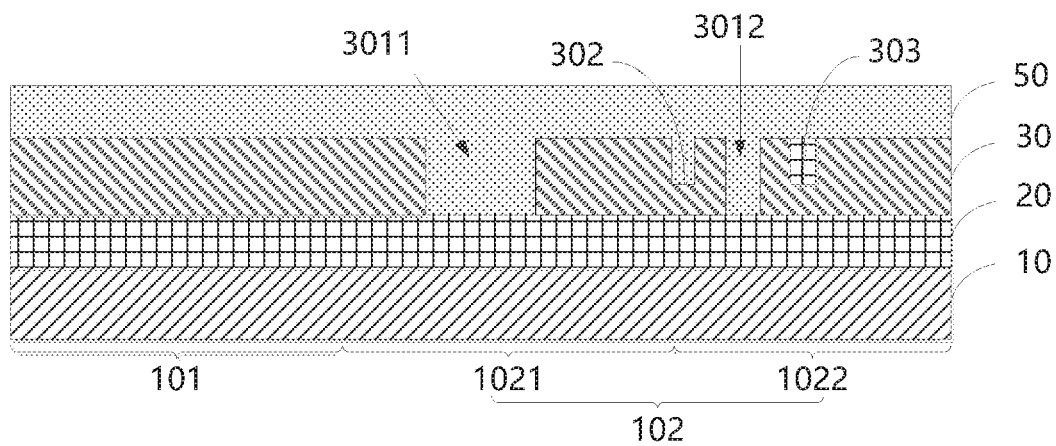
FIG. 5 is a second schematic cross-sectional view of the OLED display panel according to another preferred embodiment of the present disclosure.

Preferably, the cathode 30 located on the peripheral wiring area 1022 includes a first recessed area 302 and a second recessed area 303, and the first recessed area 302 and the second recessed area 303 are correspondingly disposed on two sides of the at least one second sub via hole 3012. For details, refer to FIG. 5, wherein the first recessed area 302 and the second recessed area 303 are formed, such that the second sub-via hole 3012 forms a retaining wall structure. The retaining wall structure can improve an ability of the OLED display panel to block water oxygen. In addition, the second, sub via hole 3012 is filled with the organic flat layer 20, and the organic flat layer 20 located in the second sub via hole 3012 increases an adhesion between the encapsulation layer 50, the cathode 30, and the organic flat layer 20, thereby improving a package performance of the OLED display panel.

Preferably, the at least one first sub, via hole 301 intersects the at least one second sub via hole 3012.

Figure 6:
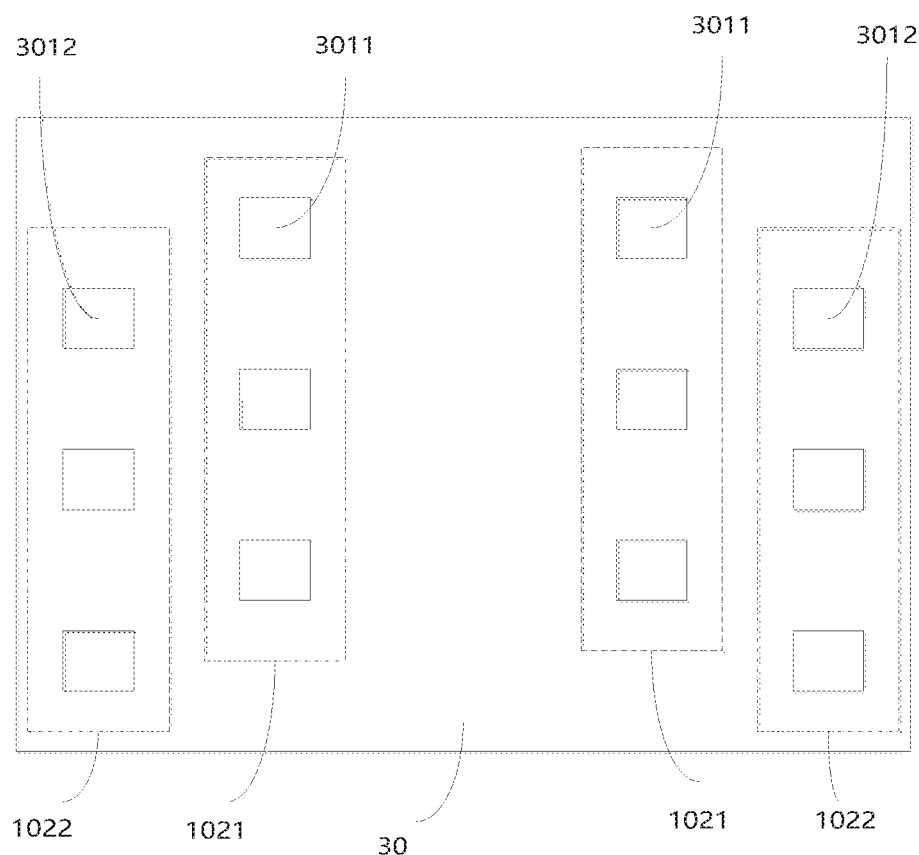
FIG. 6 is a schematic top plan view of a cathode according to another preferred embodiment of the present disclosure.

In details, refer to FIG. 6, a schematic top plan view of a cathode according to another preferred embodiment of the present disclosure is provided. The at least one first sub via hole 3011 intersects the at least one second sub via hole 3012. The first sub-via hole 3011 may have a square shape or a rectangular shape, and the second sub-via hole 3012 may have a square shape or a rectangular shape. It should be noted that the intersection of the first sub-via hole 3011 and the second sub-via hole 3012 can reduce an unevenness of a distribution of the cathode 30, thereby ensuring a supply of a potential of the cathode 30.

Preferably, the encapsulation layer 50 includes a first inorganic layer, an organic layer, and a second inorganic layer stacked one on another.

Correspondingly, the present disclosure further provides an OLED display device including any of the OLED display panels of the above embodiments. For details, refer to the previous embodiments, and details are not described herein again.

In the embodiments, by providing at least one first sub via hole 3011 on the cathode of the signal driving area 1021, such that the encapsulation layer 50 is in contact with the organic flat layer 20 through the first sub via hole 1021, so as to increase an adhesion between the encapsulation layer 50 and the organic flat layer 20. The first recessed area 302 and the second recessed area 303 are correspondingly disposed on two sides of the at least one second sub via hole 3012, so as to further improve a package performance of the OLED display panel, thereby enhancing an ability of the OLED display panel to block water oxygen and prolonging a service life of the OLED display panel.

The OLED display panel and the display device provided by the embodiments of the present disclosure are described in detail. The principles and embodiments of the present disclosure are described in detail herein. The description of the above embodiments is merely for facilitating understanding of the present disclosure. In the meantime, those of ordinary skill in the art, according to the ideas of the present disclosure may have modifications to the specific embodiments and application scope. In conclusion, content of the specification should not be construed as limiting the present disclosure.

The invention claimed is:

1. An organic light emitting diode (OLED) display panel, comprising:
a substrate comprising a display area and a non-display area;
an organic flat layer, a cathode, and an encapsulation layer stacked on the substrate; and
an anode;
wherein the cathode located on the non-display area comprises at least one first via hole, the encapsulation layer is in contact with the organic flat layer through the at least one first via hole, and the organic flat layer located on the non-display area comprises at least one second via hole;
wherein the at least one second via hole is in one-to-one correspondence with the at least one first via hole, and the encapsulation layer is in contact with the organic flat layer through the at least one first via hole and the at least one second via hole, so as to increase a contact area between the organic flat layer and the encapsulation layer;
wherein the anode located on the non-display area comprises at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer, the at least one first via hole, the at least one second via hole, and the at least one third via hole have a same shape and size; and
wherein the non-display area comprises a signal driving area and a peripheral wiring area, the at least one first via hole comprises a first sub via hole and a second sub via hole, the cathode located on the signal driving area comprises the at least one first sub via hole, and the cathode located on the peripheral wiring area comprises the at least one second sub via hole.

2. The OLED display panel according to claim 1, wherein the cathode located on the peripheral wiring area comprises a first recessed area and a second recessed area, and the first recessed area and the second recessed area are correspondingly disposed on two sides of the at least one second sub via hole.

3. The OLED display panel according to claim 2, wherein the at least one first sub via hole intersects the at least one second sub via hole.

4. The OLED display panel according to claim 1, wherein the encapsulation layer comprises a first inorganic layer, an organic layer, and a second inorganic layer stacked one on another.

5. An organic light emitting diode (OLED) display panel, comprising:
a substrate comprising a display area and a non-display area; and
an organic flat layer, a cathode, and an encapsulation layer stacked on the substrate;
wherein the cathode located on the non-display area comprises at least one first via hole, and the encapsulation layer is in contact with the organic flat layer through the at least one first via hole; and
wherein the non-display area comprises a signal driving area and a peripheral wiring area, the at least one first via hole comprises a first sub via hole and a second sub via hole, the cathode located on the signal driving area comprises the at least one first sub via hole, and the cathode located on the peripheral wiring area comprises the at least one second sub via hole.

6. The OLED display panel according to claim 5, wherein the organic flat layer located on the non-display area comprises at least one second via hole, wherein the at least one second via hole is in one-to-one correspondence with the at least one first via hole, and the encapsulation layer is in contact with the organic flat layer through the at least one first via hole and the at least one second via hole, so as to increase a contact area between the organic flat layer and the encapsulation layer.

7. The OLED display panel according to claim 6, further comprising an anode, wherein the anode located on the non-display area comprises at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer.

8. The OLED display panel according to claim 7, wherein the at least one first via hole, the at least one second via hole, and the at least one third via hole have a same shape and size.

9. The OLED display panel according to claim 5, wherein the cathode located on the peripheral wiring area comprises a first recessed area and a second recessed area, and the first recessed area and the second recessed area are correspondingly disposed on two sides of the at least one second sub via hole.

10. The OLED display panel according to claim 9, wherein the at least one first sub via hole intersects the at least one second sub via hole.

11. The OLED display panel according to claim 5, wherein the encapsulation layer comprises a first inorganic layer, an organic layer, and a second inorganic layer stacked one on another.

12. A display device comprising an organic light emitting diode (OLED) display panel, the OLED display panel comprising:
a substrate comprising a display area and a non-display area; and
an organic flat layer, a cathode, and an encapsulation layer stacked on the substrate;
wherein the cathode located on the non-display area comprises at least one first via hole, and the encapsulation layer is in contact with the organic flat layer through the at least one first via hole; and wherein the non-display area comprises a signal driving area and a peripheral wiring area, the at least one first via hole comprises a first sub via hole and a second sub via hole, the cathode located on the signal driving area comprises the at least one first sub via hole, and the cathode located on the peripheral wiring area comprises the at least one second sub via hole.

13. The display device according to claim 12, wherein the organic flat layer located on the non-display area comprises at least one second via hole, wherein the at least one second via hole is in one-to-one correspondence with the at least one first via hole, and the encapsulation layer is in contact with the organic flat layer through the at least one first via hole and the at least one second via hole, so as to increase a contact area between the organic flat layer and the encapsulation layer.

14. The display device according to claim 13, further comprising an anode, wherein the anode located on the non-display area comprises at least one third via hole, the at least one third via hole is in one-to-one correspondence with the at least one first via hole and the at least one second via hole, and the encapsulation layer is in contact with the organic flat layer through the at least one first via hole, the at least one second via hole, and the at least one third via hole, so as to increase the contact area between the organic flat layer and the encapsulation layer.

15. The display device according to claim 14, wherein the at least one first via hole, the at least one second via hole, and the at least one third via hole have a same shape and size.

16. The display device according to claim 12, wherein the encapsulation layer comprises a first inorganic layer, an organic layer, and a second inorganic layer stacked one on another.

* * * * *